US009330783B1

(12) United States Patent
Rotbard et al.

(10) Patent No.: US 9,330,783 B1
(45) Date of Patent: May 3, 2016

(54) IDENTIFYING WORD-LINE-TO-SUBSTRATE AND WORD-LINE-TO-WORD-LINE SHORT-CIRCUIT EVENTS IN A MEMORY BLOCK

(71) Applicant: APPLE INC., Cupertino, CA (US)

(72) Inventors: Barak Rotbard, Herzlia Pituach (IL); Avraham Poza Meir, Herzlia Pituach (IL); Eyal Gurgi, Herzlia Pituach (IL); Yael Shur, Herzlia Pituach (IL); Barak Baum, Herzlia Pituach (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/572,818

(22) Filed: Dec. 17, 2014

(51) Int. Cl.
*G11C 29/00* (2006.01)
*G11C 29/02* (2006.01)
*G11C 16/26* (2006.01)
*G11C 16/14* (2006.01)

(52) U.S. Cl.
CPC ............... *G11C 29/02* (2013.01); *G11C 16/14* (2013.01); *G11C 16/26* (2013.01); *G11C 29/006* (2013.01)

(58) Field of Classification Search
CPC ...... G11C 29/02; G11C 29/006; G11C 16/14; G11C 16/26
USPC ........... 365/185.11, 185.02, 185.09, 200, 201
See application file for complete search history.

(56) References Cited

U.S. PATENT DOCUMENTS

| | | | |
|---|---|---|---|
| 4,841,482 A | 6/1989 | Kreifels et al. | |
| 5,181,025 A * | 1/1993 | Ferguson | G08C 19/28 340/870.21 |
| 5,331,594 A * | 7/1994 | Hotta | G11C 29/50 365/200 |
| 5,372,712 A * | 12/1994 | Petit | B01J 8/22 210/151 |
| 5,428,621 A | 6/1995 | Mehrotra et al. | |
| 5,440,516 A * | 8/1995 | Slemmer | G11C 29/48 365/189.08 |
| 5,581,509 A * | 12/1996 | Golla | G11C 8/12 365/185.09 |
| 5,602,778 A | 2/1997 | Futatsuya et al. | |
| 5,606,527 A * | 2/1997 | Kwack | G11C 29/02 365/185.09 |
| 5,684,747 A | 11/1997 | Urai | |
| 5,748,545 A * | 5/1998 | Lee | G11C 29/02 365/189.11 |
| 5,796,653 A | 8/1998 | Gaultier | |
| 5,847,995 A | 12/1998 | Kobayashi et al. | |
| 5,898,637 A | 4/1999 | Lakhani et al. | |
| 6,031,772 A * | 2/2000 | Nagatomo | G11C 7/24 365/201 |
| 6,545,910 B2 | 4/2003 | Byeon et al. | |
| 6,650,585 B2 | 11/2003 | Chevallier | |
| 6,707,078 B1 | 3/2004 | Shiraiwa et al. | |
| 6,813,183 B2 | 11/2004 | Chevallier | |
| 7,089,460 B2 | 8/2006 | Fu | |
| 7,212,454 B2 | 5/2007 | Kleveland et al. | |
| 7,319,623 B1 | 1/2008 | Yuan et al. | |
| 7,440,347 B1 * | 10/2008 | Vogelsang | G11C 29/02 365/149 |

(Continued)

OTHER PUBLICATIONS

U.S. Appl. No. 14/617,961 Office Action dated Feb. 25, 2016.

*Primary Examiner* — Tan T. Nguyen
(74) *Attorney, Agent, or Firm* — D.Kligler IP Services Ltd.

(57) ABSTRACT

An apparatus includes a memory and a memory controller. The memory includes a memory block that includes memory cells connected by word lines. The memory controller is configured to store data in the memory cells, and to identify a suspected short-circuit event in the memory block by recognizing a deviation of a performance characteristic of at least a given word line in the memory block relative to the performance characteristic of remaining word lines in the memory block.

19 Claims, 2 Drawing Sheets

(56) References Cited

U.S. PATENT DOCUMENTS

| | | |
|---|---|---|
| 7,463,529 B2 | 12/2008 | Matsubara |
| 8,305,807 B2 | 11/2012 | Shah et al. |
| 8,379,454 B2 | 2/2013 | Kochar et al. |
| 8,432,732 B2 | 4/2013 | Li et al. |
| 8,514,630 B2 | 8/2013 | Huynh et al. |
| 8,730,722 B2 | 5/2014 | Koh et al. |
| 8,902,657 B2 * | 12/2014 | Iwai ............... H01L 27/1157 365/185.11 |
| 2009/0225607 A1 | 9/2009 | Chen et al. |
| 2010/0329052 A1 * | 12/2010 | Chen ..................... G11C 8/08 365/200 |
| 2014/0189438 A1 | 7/2014 | Arbel et al. |
| 2014/0254264 A1 | 9/2014 | Dutta et al. |
| 2014/0269071 A1 | 9/2014 | Pandya et al. |
| 2014/0321202 A1 | 10/2014 | Yang et al. |

\* cited by examiner

IDENTIFYING WORD-LINE-TO-SUBSTRATE AND WORD-LINE-TO-WORD-LINE SHORT-CIRCUIT EVENTS IN A MEMORY BLOCK

TECHNICAL FIELD

Embodiments described herein relate generally to memory devices, and particularly to methods and systems for failure identification in memory devices.

BACKGROUND

Non-Volatile Memory (NVM) devices are subject to failures, such as word-line-to-substrate and word-line-to-word-line shorts, and require early detection in order to avoid data loss. Examples of prior art techniques are provided below.

U.S. Pat. No. 7,212,454, to Kleveland, et al., whose disclosure is incorporated herein by reference, describes a method and apparatus for programming a memory array. In one embodiment, after each word line is programmed, an attempt is made to detect a defect on that word line. If a defect is detected, the word line is repaired with a redundant word line. The word lines are then reprogrammed and rechecked for defects. In another embodiment, after each word line is programmed, an attempt is made to detect a defect on that word line. If a defect is detected, that word line is repaired along with a previously-programmed adjacent word line.

U.S. Pat. No. 8,379,454, to Kochar, et al., whose disclosure is incorporated herein by reference, describes techniques and corresponding circuitry for detection of broken word lines in a memory array. An "inter-word line" comparison where a program loop counts of different word lines are compared in order to determine whether a word line may be defective. A number of programming pulses needed for the cells along a word line WLn is compared to the number needed for a preceding word line, such as WLn or WL(n−1), to see whether it exceeds this earlier value by a threshold value.

U.S. Pat. No. 6,545,910, to Byeon, et al., whose disclosure is incorporated herein by reference, describes a non-volatile semiconductor memory device having word line defect check circuit. The non-volatile semiconductor memory device includes: a memory cell array including a plurality of cell array blocks including a plurality of cell strings that consist of floating gate memory cell transistors that its drain-source channels are in series connected each other between string select transistors and ground select transistors and that its control gates are correspondingly connected to a plurality of word lines. A word line short check circuit inputs different levels of voltage to each of the plurality of word lines that is adjacent from one another during a predetermined charging time, and generates a short sense signal that indicates whether short between adjacent word lines has occurred by checking voltage levels of the word lines that were supplied with a same level of voltage, after the charging time is lapsed by a predetermined time.

U.S. Pat. No. 6,813,183, to Chevallier, et al., whose disclosure is incorporated herein by reference, describes a method and system for externally triggered leakage detection and repair in a flash memory device. In an embodiment the method includes operating a flash memory device to store data in a number of flash cells and initiating an operation to detect or repair leaky flash cells in the flash memory device by coupling one or more selected signals to the flash memory device from a source external to the flash memory device.

SUMMARY

An embodiment that is described herein provides an apparatus including a memory and a memory controller. The memory includes a memory block that includes memory cells connected by word lines. The memory controller is configured to store data in the memory cells, and to identify a suspected short-circuit event in the memory block by recognizing a deviation of a performance characteristic of at least a given word line in the memory block relative to the performance characteristic of remaining word lines in the memory block.

In some embodiments, the suspected short-circuit event includes either a short-circuit between two of the word lines or a short-circuit between a word line and a substrate of the memory block. In an embodiment, the memory controller is configured to recognize the deviation in a number of readout errors in the data read from the memory cells of at least the given word line, relative to the remaining word lines. In another embodiment, the memory controller is configured to recognize the deviation by detecting an imbalance between counts of respective data values in the data read from the memory cells of at least the given word line, relative to the remaining word lines.

In yet another embodiment, the memory controller is configured to recognize the deviation in a threshold voltage distribution of the memory cells of at least the given word line, relative to the remaining word lines. In still another embodiment, the memory controller is configured to recognize the deviation in a programming or erasure voltage of at least the given word line, relative to the remaining word lines.

In a disclosed embodiment, the memory controller is configured to recognize the deviation in a programming or erasure duration of at least the given word line, relative to the remaining word lines. In an example embodiment, the memory controller is configured to recognize the deviation by detecting in at least the given word line at least one erased memory cell whose threshold voltage has become positive. The memory controller may be configured to recognize the deviation by detecting that a count of erased memory cells whose threshold voltage has become positive progressively decreases in successive word lines starting from the given word line.

In some embodiments, the memory controller is configured to recognize the deviation in an electrical resistance between at least the given word line and a substrate of the memory block, relative to the remaining word lines. In an embodiment, the memory controller is configured to detect that the suspected short-circuit event is between a substrate of the memory block and at least one of the word lines subsequent to the given word line in the memory block.

In another embodiment, the memory controller is configured to identify the suspected short-circuit event while the memory and the memory controller are operating in a host system. In yet another embodiment, the memory includes one or more sensors for sensing voltage on at least one of the word lines, and the memory controller is configured to identify the suspected short-circuit event based on the sensed voltage.

There is additionally provided, in accordance with an embodiment that is described herein, a method including storing data in a memory that includes a memory block including memory cells connected by word lines. A suspected short-circuit event in the memory block is identified by recognizing a deviation of a performance characteristic of at least a given word line in the memory block relative to the performance characteristic of remaining word lines in the memory block.

These and other embodiments will be more fully understood from the following detailed description of the embodiments thereof, taken together with the drawings in which:

DETAILED DESCRIPTION OF EMBODIMENTS

Overview

Figure 1:
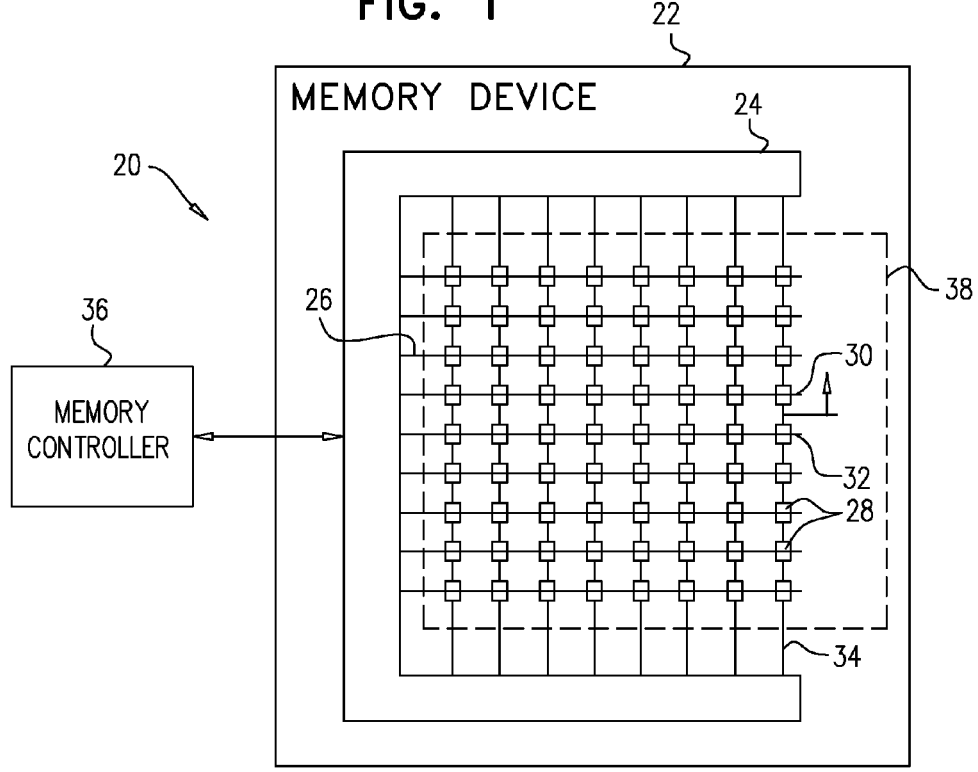
FIG. 1 is a block diagram that schematically illustrates a memory system, in accordance with an embodiment that is described herein.

Non-volatile memory (NVM) devices are used in various storage applications in which it is advantageous to identify potential failures, such as word-line-to-substrate and word-line-to-word-line shorts, and take corrective actions in order to provide high storage reliability.

Embodiments that are described hereinbelow provide improved methods and systems for reliably storing data in memory devices. The methods and systems described herein identify suspected short-circuit events, often in the early stages of their formation. As such, the disclosed techniques enable a memory controller to copy or otherwise save data before it is corrupted or lost as a result of a word-line-to-substrate short.

In some embodiments, an NVM comprising multiple memory cells that are connected by word lines are controlled by a memory controller, which is configured to store data in the memory cells. The controller is configured to identify suspected short-circuit events in a memory block by recognizing a deviation of some performance characteristic of a given word line in the memory block relative to the performance characteristic of the remaining word lines in the memory block. In an embodiment, the memory controller is configured to identify the suspected short-circuit events while the memory and the memory controller are operating in a host system.

Various short-circuit detection techniques are described herein, in which the memory controller checks for deviations in various performance characteristics. In some embodiments the memory controller identifies the short by comparing a number of readout errors in the data read from the memory cells of the given word line, relative to the other word lines in the memory block. In another embodiment, a number of "0" bits is expected to be balanced with a number of "1" bits in a given word line, and the memory controller may identify the short by detecting an imbalance between the number of "0" bits and the number of "1" bits in the data read from the memory cells of the given word line.

Threshold voltages of memory cells may also be used to identify suspected short-circuit events. In some embodiments, the memory controller identifies the short by detecting a deviation in a threshold voltage distribution of the memory cells of the given word line relative to the other word lines. In other embodiments, the memory controller recognizes a deviation in a programming or erasure voltage of the given word line.

Programming or erasure duration can also be used to identify abnormalities in the given word line, and such abnormalities may be used to predict or detect short-circuit events. In an embodiment the memory controller identifies a short by comparing a programming or erasure duration of the given word line with the programming or erasure duration of the remaining word lines. Typically, longer than expected programming or erasure durations are good indications of word-line-to-substrate or word-line-to-word-line short.

In typical NAND Flash devices threshold voltages of erased cells are negative. In some embodiments, the memory controller may identify a suspected short-circuit event by detecting "erase penetration"—detecting at least one erased memory cell whose threshold voltage has become positive. Specifically, a scenario in which the number of memory cells that exhibit erase penetration reduced progressively from word line to word line, starting from a given word line is a good indication of word-line-to-word line short at the given word line.

In many practical cases, a short-circuit event develops gradually over time or with use. In such cases, the resistance between the word line in question and the substrate or neighbor word line decreases over time and usage. In some embodiments, the memory controller is configured to identify the short by comparing the electrical resistance to that of other word lines. In the present context, the term "suspected short-circuit event" refers to a word-line-to-substrate or word-line-to-word-line resistance that falls below some predefined reference resistance, not necessarily an absolute short of zero Ohms.

The above techniques are useful to increase the reliability of NVM devices by identifying failures, such as word-line-to-substrate and word-line-to-word-line shorts. Failure identification allows corrective action to be taken in advance, by preventing the data from being stored in the affected cells, and/or by copying previously-stored data to functional cells.

System Description

FIG. 1 is a block diagram that schematically illustrates a memory system 20 comprising a memory device and a memory controller 36, in accordance with an embodiment that is described herein. Controller 36 accepts data for storage from a host (not shown in FIG. 1), stores the data in memory 22, and retrieves data from memory 22 and provides it to the host.

System 20 may be used in any suitable application with any suitable type of host, such as a Solid-State Disk (SSD) that stores data for a host computer, computing devices, mobile phones or other communication terminals, removable memory modules such as Disk-On-Key (DOK) devices, Secure Digital (SD) cards, Multi-Media Cards (MMC) and embedded MMC (eMMC), digital cameras, music and other media players and/or any other system or device in which data is stored and retrieved.

Memory device 22 comprises multiple memory cells 28 arranged in memory blocks. In the present example, device 22 comprises a non-volatile NAND Flash device, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM) and/or magnetic RAM (MRAM), can also be used. The disclosed techniques are applicable in various two-dimensional and three-dimensional memory device configurations.

In the context of the present patent application and in the claims, the term, "analog memory cell" is used to describe any non-volatile memory (NVM) cell that holds a continuous, analog value of a physical parameter, such as an electrical voltage or charge. Any suitable type of analog memory cells, such as the types listed above, can be used. In the present example, each memory device 22 comprises a NVM of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in memory cells 28 by programming the cells to assume respective memory states, which are also referred to as programming levels. The programming levels are selected from a finite set of possible levels, and each level corresponds to a certain nominal storage value. For example, a 2 bit/cell multi-level cell (MLC) can be programmed to assume one of four possible programming levels by writing one of four possible nominal storage values into the cell. Alternatively, a 3 bit/cell triple-level cell (TLC) can be programmed to assume one of eight possible programming levels by writing one of eight possible nominal storage values into the cell.

Typically, a given memory device comprises multiple erasure blocks (also referred to as memory blocks), e.g., groups of memory cells that are erased together. Data typically cannot be reprogrammed in-place, and memory blocks are therefore erased before being programmed with other data. Each memory block comprises multiple memory pages. Typically, but not necessarily, each page is stored in a word line. In a TLC device, each word line is configured to store up to three pages.

In a given memory block, memory cells 28 are arranged in rows associated with respective word lines 26, and columns associated with respective bit lines 34. Each memory cell is connected to a respective word line (WL) 26 and each bit line 34 is connected to a string of the memory cells. The memory cells, word lines and bit lines of a given memory blocks are fabricated on a substrate 38, e.g., made of silicon or other suitable substrate material. FIG. 1 shows a single memory block, for the sake of clarity.

In some embodiments, the functionality of the memory controller is carried out by the host. In alternative embodiments, the host and memory controller are two separate entities with different functionalities. A Read/Write (R/W) unit 24 controls the bit lines and word lines so as to program, read and erase memory cells. R/W unit 24 is typically connected to memory controller 36 or to the host, for receiving data for storage in the memory and for sending data retrieved from memory.

The configuration of memory system 20 shown in FIG. 1 is an example configuration, which is chosen purely for the sake of conceptual clarity. In alternative embodiments, any other suitable configuration can be used for implementing the memory system. Certain elements of memory system 20 can be implemented using hardware, such as using one or more Application-Specific Integrated Circuits (ASICs) or Field-Programmable Gate Arrays (FPGAs) or other device types. Additionally or alternatively, certain elements of memory system 20 can be implemented using software, or using a combination of hardware and software elements.

Memory controller 36 may comprise one or more processors or cores that are capable of running software to carry out the functions described herein. The software may be downloaded to the processors or cores in an electronic form, over a network, for example, or it may, alternatively or additionally, be provided and/or stored on non-transitory tangible media, such as magnetic, optical, or electronic memory.

Detection of a Word-Line-to-Substrate Short

In a given memory block, Word lines (WL) 26 should typically be electrically isolated from one another and from substrate 38 to allow proper data storage in the respective memory cells. An electrical short between the WL and the substrate or between WLs may result in performance degradation and eventually loss of stored data in respective cells connected to the shorted WL and in additional cells connected to WLs in the same memory block that are affected by the shorted WL.

Memory failures, such as WL-to-substrate or WL-to-WL shorts may appear in several failure modes that may occur or develop at different stages of the memory device life cycle. For example, some shorts occur during manufacturing processes of the device, while other shorts may develop over time and usage during normal operation of the device in a host system. The described techniques provide solutions to handle both types of shorts.

In many cases a short-circuit event is a developing event, beginning with a slight decrease in resistance and gradually developing to a full-blown short circuit. In other cases a full-blown short may occur immediately, typically during production. As noted above, the term "short-circuit event" in the present application relates to any event in which an electrical resistance between the WL and the substrate, or an electrical resistance between the WL and a neighboring WL, falls below some predefined minimum tolerable resistance.

For example, a typical tolerable resistance in given NVM devices may be hundreds of Kilo-Ohms (KO). When the resistance decreases to a double-digit level (e.g., 50) KO, this is already an intermediate level in which the resistance falls below the threshold but the affected memory cells are still functional. However, when the resistance further decreases and falls to a single-digit KO level and below, the affected memory cells may be difficult or impossible to program.

The above resistance levels of memory system 20 are example resistance levels, which are chosen purely for the sake of conceptual clarity. According to the above example, a threshold of 100 KO may provide sufficient advance warning that a full-blown short is imminent.

In typical NAND devices the WLs are numbered in a block from the first WL (typically denoted WL0) to the last WL. In this convention, the first word line (WL0) denotes the word line that is nearest to the source sides of the bitlines, and the last word line denotes the word line that is nearest to the drain sides of the bit lines. Note that one or more of the WLs may comprise dummy WLs that are not utilized for data storage.

Detection of WL-to-Substrate Short-Circuit Events

A WL-to-substrate short in a specific WL (e.g., WL number 3, denoted WL 3) of a given block typically results in abnormality in storage or readout of data in the preceding WL's (e.g., WL number 0 to WL number 3). In the example of FIG. 1, if WL 30 is shorted to the substrate, all WL's from WL 30 toward the top of the figure are affected (e.g., non-functional). WL 32 (which is the next WL after WL 30) and the subsequent WLs toward the bottom of the figure are usually not affected by the short in WL 30.

In some embodiments, the present techniques may detect storage/readout abnormality in a given word line, relative to the other word lines in the block, and use this abnormality as an indication of word line-to-substrate short in one or more of the WLs from the given WL until the end of the block. For example, controller 36 may monitor a first WL (e.g., WL0) of a given block, to identify a WL-to-substrate short in the entire block. In other embodiments the controller may monitor WL20 in the block to detect a WL-to-substrate short in one or more of the WLs from WL20 and above (e.g., 25) until the end of the given block. In this example, in case of a detectable WL-to-substrate short in the monitoring of WL20, the WLs below WL20 (e.g., WL 0 to WL19) are not suspected to have a WL-to-substrate short. The above WL numbers are example WL numbers, which are chosen for the sake of conceptual clarity.

In an embodiment, controller 36 may comprise an Error Correction Code (ECC) module (not shown in FIG. 1) which is able to assess a number of errors in readout of a page from a certain WL, e.g., WL0. Controller 36 can then compare the number of errors in the tested WL0 (so as to monitor the entire block) to the average error count in the other word lines of the memory block. If the number of errors in the tested WL0 is higher than the expected average count, then the block is suspected to have a short between at least one of its WLs and the substrate. For example, upon detecting a suspiciously high number of errors in a given page that was read from memory, the memory controller may read a page from the next word line in order to assess whether this word line may be shorted.

In another embodiment, controller 36 checks the balance between the number of "0" bits and the number of "1" bits in a page read from a given WL. Typically the amount should be balanced (e.g., a similar amount of "0" and "1" bits). A substantial imbalance relative to the other word lines (e.g., 80% "0" and 20% "1") may indicate a short between one of the WLs and the substrate. A user of the memory system may set control limits for an imbalance level, in order for a short to be assumed. The above imbalance percentage of memory system 20 are example percentage, any other suitable imbalance threshold or limit may be selected by a user.

In some embodiments, controller 36 detects a deviation of the threshold voltage ($V_{th}$) distribution of cells 28 on WL0 from the distribution on the other word lines. If the $V_{th}$ distribution is similar to that of other word lines, then the block may be assumed to have no shorts. If a deviation is detected, then the block may be suspected to contain a short between at least one of the WLs and the substrate.

In some embodiments, controller 36 compares the programming voltage needed to program WL0 (Vpp, measured between WL0 and the substrate) to the average Vpp used in the other word lines in the memory block. If the measured Vpp significantly exceeds the expected Vpp, i.e., if WL0 requires an exceedingly high voltage to program its cells, controller 36 may conclude that a WL-to-substrate short is present in the block.

In some embodiments, controller 36 compares the erasure voltage needed to erase WL0 ($V_{ee}$, measured between WL0 and the substrate) to the $V_{ee}$ used in the other word lines in the memory block. If the measured $V_{ee}$ significantly exceeds the expected $V_{ee}$, i.e., if WL0 requires an exceedingly high erasure voltage, controller 36 may conclude that a WL-to-substrate short is present in the block.

In an embodiment, controller 36 compares the duration of programming or erasure for a given group of cells 28 (e.g., a given WL) with the programming or erasure duration in the other word lines. In this embodiment, as long as the programming (or erasure) duration is similar to that of the other word lines in the memory block, the block is not suspected to have a short between a WL and the substrate.

In another embodiment, controller 36 detects WL-to-substrate short in a block by detecting "erase penetration" in a given WL. Typically, erased cells are expected to have negative threshold voltage values. Erase penetration is defined as an event in which the threshold voltage of one or more erased memory cells become positive. In such a case, the block may be suspected to contain one or more shorted WLs to the substrate.

In alternative embodiments, memory controller 36 may detect suspected WL-to-substrate short-circuit events by detecting a deviation in any other suitable performance characteristic of the given WL, relative to the other WLs in the memory block.

Detection of WL-to-WL Short-Circuit Events

A WL-to-WL short in a given WL typically results in abnormality in storage or readout of data in the shorted WLs and their neighbors. Consider, for example, a short between WL(n) and WL(n+1). In a typical scenario, the short may have two observable effects—A large number of errors (e.g., bit flips) on the preceding word line (WL(n−1)), and significant erase penetration on subsequent word lines (WL(n+1), WL(n+2), WL(n+3) . . . ).

WL(n−1) exhibits a large number of errors because during readout of WL(n−1), a relatively high pass voltage is applied to WL(n) and a lower pass voltage is applied to WL(n+1). Because of the short, however, the effective pass voltage on WL(n) is reduced, resulting in a high number of errors in readout of WL(n−1).

In the subsequent word lines (WL(n+1), WL(n+2), WL(n+3) . . . ), the number of memory cells suffering from erase penetration typically decreases progressively from word line to word line. In other words, WL(n+1) has the highest number of cells having erase penetration, WL(n+2) has a lower number, WL(n+3) has an even lower number, and so on.

The reason for the above effect is that due to the short (or low impedance between WL(n) and WL(n+1)), the programming time for WL(n) and WL(n+1) is long, and therefore more programming pulses with higher voltages are applied to these WLs. The WLs above WL(n+1) (e.g., WL(n+2), WL(n+3)) are erased but are biased with a programming pass voltage (Vpp) during the long programming time of WL(n+1). The Vpp value is highest in WLs that are close to the programmed WL, and are reduced gradually on each successive WL. Therefore, the WLs closest to the shorted WLs suffer the strongest erase penetration. The strong erase penetration results in a large number of program errors when these word lines are programmed, since the verification thresholds used in the programming operations are not positioned correctly.

In some embodiments, memory controller 36 uses the above-described observable effects to identify suspected WL-WL short-circuit events. In some cases, these techniques are used even though the memory device does not report programming failure—The disclosed techniques are more sensitive than programming-failure detection, and can identify WL-WL shorts in their early stages while programming is still successful.

In some embodiments, controller 36 identifies that the programming time ($T_{PROG}$) on a pair of WLs is considerably longer than on the other WLs in the block. Such an effect is highly indicative of WL-WL short. In an example embodiment, controller 36 may measure the $T_{PROG}$ of the various WL. Upon detecting two consecutive WLs (WL(n) and WL(n+1) in this example) having an exceedingly long $T_{PROG}$, controller 36 may check for high erase penetration of the subsequent WLs (WL(n+2), WL(n+3) . . . ). If considerable (and possibly gradually decreasing) erase penetration is observed, controller 36 may conclude that the long $T_{PROG}$ is caused by WL-WL short between WL(n) and WL(n+1).

In alternative embodiments, memory controller 36 may detect suspected WL-to-WL short-circuit events by detecting a deviation in any other suitable performance characteristic of the given WL, relative to the other WLs in the memory block.

Short-Circuit Detection Method Description

Figure 2:
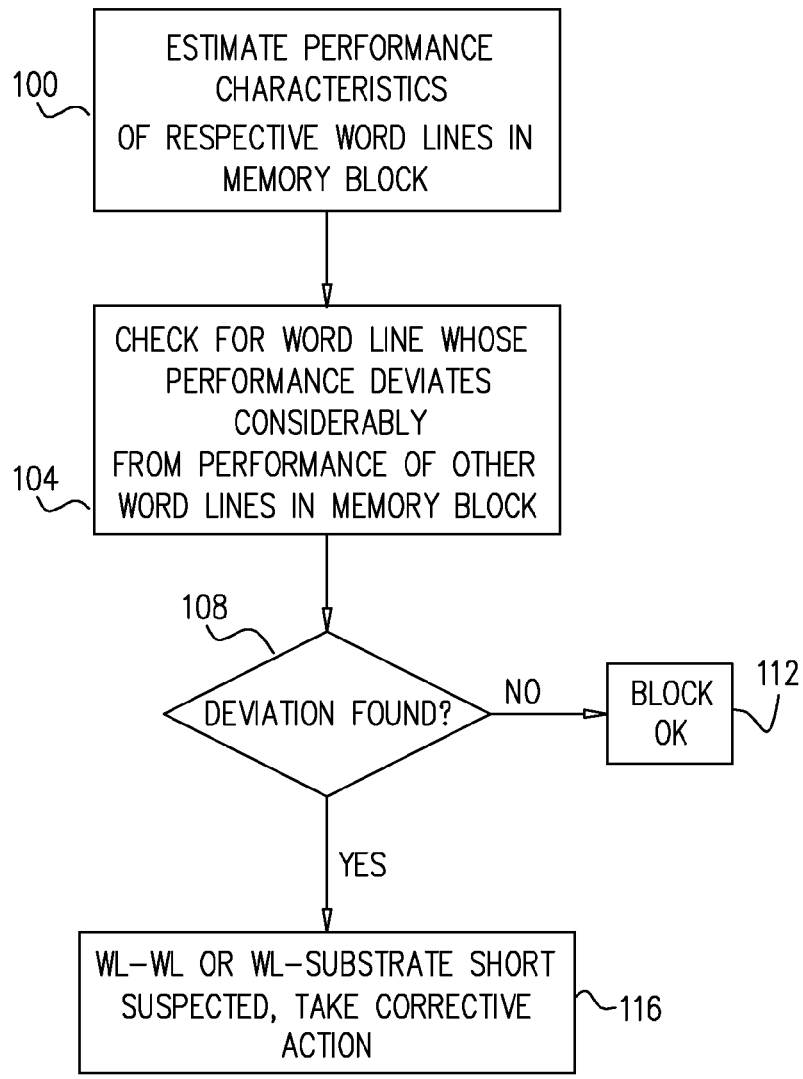
FIG. 2 is a flow chart that schematically illustrates a method for identifying a suspected short-circuit event in a memory block, in accordance with an embodiment that is described herein.

FIG. 2 is a flow chart that schematically illustrates a method for identifying suspected short-circuit events in a memory block, in accordance with an embodiment that is described herein. The method begins with memory controller 36 assessing the performance characteristics of the various word lines in a memory block, at a performance assessment step 100. Any of the performance characteristics described above, or any other suitable performance characteristic, can be used.

At a deviation checking step 104, controller 36 looks for at least one word line whose performance characteristic deviates from the performance characteristics of the remaining word lines in the memory block by more than a predefined tolerable amount.

If no deviation is found, at a decision step 108, the block is declared functional, at a functional termination step 112. Otherwise, i.e., if a deviation is detected, processor 36 regards the word line in question as possibly shorted (to the substrate or to a neighboring word line), at a failure termination step 116.

In such a case, controller 36 typically takes suitable corrective actions. For example, the controller may store data intended for programming to other memory cells which are not affected by the suspected short (within the block or in another block).

All the above detection methods of memory system 20 are applicable to other types of memory systems (both NVM and volatile memory), and are example detection methods, which are chosen for the sake of conceptual clarity. In alternative embodiments, any other suitable detection methods may be applied to identify a WL-to-WL or WL-to-substrate short in a memory block. For example, memory device 22 may comprise one or more sensors for sensing the voltage on at least one of the word lines. In such an embodiment, controller 36 may identify WL-to-WL or WL-to-substrate shorts based on the sensed word line voltages.

It will thus be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a memory, comprising a memory block that comprises memory cells connected by word lines; and
a memory controller configured to store data in the memory cells, and to identify a suspected short-circuit event in the memory block, while the memory and the memory controller are operating in a host system, by recognizing a deviation of a performance characteristic of at least a given word line in the memory block relative to the performance characteristic of remaining word lines in the memory block.

2. The apparatus according to claim 1, wherein the suspected short-circuit event comprises at least one of a short-circuit between two of the word lines and a short-circuit between a word line and a substrate of the memory block.

3. The apparatus according to claim 1, wherein the memory controller is configured to recognize the deviation by detecting an imbalance between counts of respective data values in the data read from the memory cells of at least the given word line, relative to the remaining word lines.

4. The apparatus according to claim 1, wherein the memory controller is configured to recognize the deviation in a threshold voltage distribution of the memory cells of at least the given word line, relative to the remaining word lines.

5. The apparatus according to claim 1, wherein the memory controller is configured to recognize the deviation in a programming or erasure voltage of at least the given word line, relative to the remaining word lines.

6. The apparatus according to claim 1, wherein the memory controller is configured to recognize the deviation in a programming or erasure duration of at least the given word line, relative to the remaining word lines.

7. The apparatus according to claim 1, wherein the memory controller is configured to recognize the deviation by detecting in at least the given word line at least one erased memory cell whose threshold voltage has become positive.

8. The apparatus according to claim 7, wherein the memory controller is configured to recognize the deviation by detecting that a count of erased memory cells whose threshold voltage has become positive progressively decreases in successive word lines starting from the given word line.

9. The apparatus according to claim 1, wherein the memory controller is configured to recognize the deviation in an electrical resistance between at least the given word line and a substrate of the memory block, relative to the remaining word lines.

10. The apparatus according to claim 1, wherein the memory controller is configured to detect that the suspected short-circuit event is between a substrate of the memory block and at least one of the word lines subsequent to the given word line in the memory block.

11. The apparatus according to claim 1, wherein the memory comprises one or more sensors for sensing voltage on at least one of the word lines, and wherein the memory controller is configured to identify the suspected short-circuit event based on the sensed voltage.

12. An apparatus, comprising:
a memory, comprising a memory block that comprises memory cells connected by word lines; and
a memory controller configured to store data in the memory cells, and to identify a suspected short-circuit event in the memory block by recognizing a deviation in a number of readout errors in the data read from the memory cells of at least the given word line, relative to remaining word lines in the memory block.

13. A method, comprising:
storing data in a memory that comprises a memory block comprising memory cells connected by word lines; and
using a memory controller, identifying a suspected short-circuit event in the memory block, while the memory and the memory controller are operating in a host system, by recognizing a deviation of a performance characteristic of at least a given word line in the memory block relative to the performance characteristic of remaining word lines in the memory block.

14. The method according to claim 13, wherein identifying the suspected short-circuit event comprises identifying at least one of a short-circuit between two of the word lines and a short-circuit between a word line and a substrate of the memory block.

15. The method according to claim 13, wherein identifying the suspected short-circuit event comprises recognizing the deviation in a number of readout errors in the data read from the memory cells of at least the given word line, relative to the remaining word lines.

16. The method according to claim 13, wherein identifying the suspected short-circuit event comprises recognizing the deviation in a programming or erasure voltage of at least the given word line, relative to the remaining word lines.

17. The method according to claim 13, wherein identifying the suspected short-circuit event comprises recognizing the deviation in a programming or erasure duration of at least the given word line, relative to the remaining word lines.

18. The method according to claim 13, wherein identifying the suspected short-circuit event comprises recognizing the deviation by detecting in at least the given word line at least one erased memory cell whose threshold voltage has become positive.

19. The method according to claim 13, wherein identifying the suspected short-circuit event comprises detecting that the suspected short-circuit event is between a substrate of the memory block and at least one of the word lines subsequent to the given word line in the memory block.

\* \* \* \* \*